Oct. 12, 1965 P. J. McCOY ETAL 3,211,586

THERMOELECTRIC CONVERTER

Original Filed June 15, 1960

WITNESSES

Leon J. Taza

James H. Young

INVENTORS
Peter J. McCoy and
Thomas R. Murray

BY Z. L. Dermer

ATTORNEY

United States Patent Office 3,211,586

Patented Oct. 12, 1965

3,211,586

THERMOELECTRIC CONVERTER

Peter J. McCoy, New York, N.Y., and Thomas R. Murray, Pittsburgh, Pa., assignors to Westinghouse Electric Corporation, Pittsburgh, Pa., a corporation of Pennsylvania Original application June 15, 1960, Ser. No. 36,269. Divided and this application June 9, 1964, Ser. No. 373,647

2 Claims. (Cl. 136—4)

Figure 1:
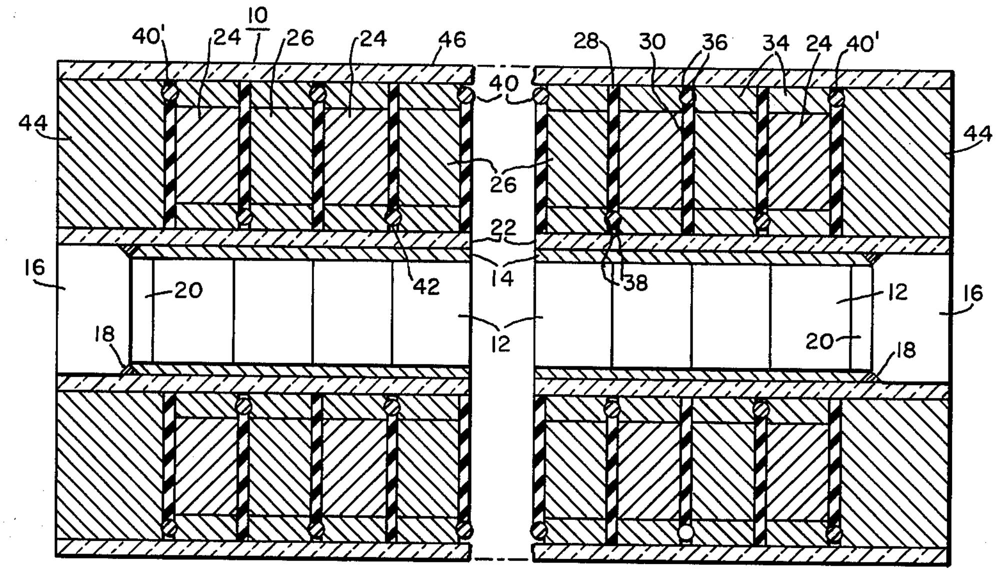

This application is a division of application Serial No. 36,269, filed June 15, 1960, and assigned to the same assignee as this application.

The present invention relates to an arrangement for the direct conversion of heat into electricity, and more particularly to a new and improved thermoelectric element arranged in certain modifications thereof for use in combination with the nuclear reactor fuel element.

In the construction of elongated tubular thermoelectric elements, a plurality of tandemly arranged, annular or ring-shaped members (referred to herein as wafers) are formed alternately from thermoelectrically positive and thermoelectrically negative material, it is necessary to provide a predetermined electrical current flow path through the thermoelectric wafers. In accordance with the prior art, the manner in which such an electrical flow path was achieved comprises the use of inner and outer contacting sleeves joined respectively to adjacent p and n thermoelectric wafers in an alternating array to provide a sinusoidal current flow path. The inner group of contacting sleeves are normally thermally coupled to a source of heat while the outer group of tubular contact sleeves are thermally coupled to a relatively cooler medium such as a fluid coolant. The temperature difference across the thermoelectric element results in the generation, through the Seebeck effect, of electrical power.

The use of the inner and outer contacting sleeves to form the electrical flow path through the tandemly arranged annular thermoelectric wafers normally requires the adjacent thermoelectric annuli to be axially spaced from one another and also necessitates the bonding of each of the bridging sleeves to each of the adjacent thermoelectric wafers. The fabrication of a thermoelectric tubular member wherein the annular briding contactors are secured to adjacent annular thermoelectric wafers results in an extremely difficult structure to fabricate. Problems have arisen with respect to the bonding of the bridging contacting sleeves to the thermoelectric wafers particularly in view of the relative rigidity of the thermoelectric materials and in connection with problems of thermal expansion caused by differences in the expansion coefficients of the thermoelectrically P-type material, the thermoelectrically N-type material and the materials forming the contacting sleeves. The bonds between the brindging contacting sleeves and the thermoelectric wafers must exhibit good mechanical strength, good electrical bonding between two successive elements and good thermal contact between the thermoelectric wafers and the bridging sleeves. Further, the assembly technique must be such that no damage occurs to the thermoelectric wafers during assembly. In addition, it is necessary to have a contacting means which permits the use of as much heat transfer area as possible while maintaining low electrical resistance.

Accordingly, it is an object of this invention to provide a new and improved thermoelectric construction including a number of tandemly arranged thermoelectric ring members having an effective means for providing electrical contact between adjacent members.

A further object of this invention is to provide a new and improved thermoelectric construction including a plurality of tandemly arranged annular thermoelectric wafers having novel means for providing an electrical current flow path between adjacent wafers.

A further object of this invention is to provide a new and improved thermoelectric assembly of a number of annular thermoelectric components mounted in a tandem array.

A still further object of this invention is to provide a new and improved thermoelectric assembly which assures good electrical contact between a number of tandemly arranged annular thermoelectric members along a predetermined path.

In accordance with the invention, each thermoelectric wafer is formed of annular configuration and is provided along its inner and outer circumferential surfaces with axially co-extensive conductive contacting sleeves which are secured to the thermoelectric annulus in a manner to provide a sound bond therebetween with such bond having a low electrical ressitance. Discs or washers of insulating material are interfitted between each of the adjacent tandemly arranged thermoelectric wafers to electricaly insulate one wafer from the other. Electrical contact between adjacent wafers is achieved by the use of ring members which fit into complementary grooves formed in juxtaposed ends of contacting sleeves. The rings which form an outer electrical contact between adjacent thermoelectric wafers are shaped to receive closely therein the adjacent insulating washer. Similarly, those rings forming an inner electrical current flow path between adjacent thermoelectric annuli are closely received within the opening of the adjacent washer. In this manner, the problem of joining contacting sleeves to each one of adjacent thermoelectric wafers is avoided.

These and other objects, features and advantages of the invention will become more readily apparent as the following description of an illustrative embodiment of this invention proceeds and features of novelty which characterize the invention will be pointed out in particularity in the claims annexed to and forming a part of this specification.

Figure 2:
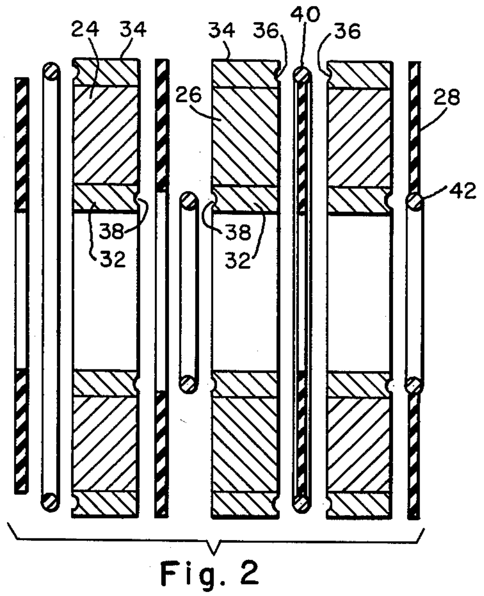

For a better understanding of the invention, reference may be had to the accompanying drawings in which:

FIGURE 1 is an enlarged sectional view of a fuel element converter embodying the principles of this invention, and FIG. 2 is an enlarged longitudinally sectioned view of certain of the components employed in fabricating the fuel element of FIGURE 1.

Referring to the drawings it will be seen that a nuclear fuel element having a thermoelectric converter formed thereon is designated generally by the reference character 10 and includes therein a central core of tandemly arranged fuel pellets 12. Each of the fuel pellets 12 desirably are formed from a suitable nuclear fuel material such as uranium oxide. The fuel pellets 12 are hermetically sealed within a cladding tube formed from a suitable high strength material having a relatively low neutron cross section. Materials forming the cladding tube 14 may comprise aluminum, stainless steel or alloys of zirconium. The fuel pellets 12 are encased within the cladding tube 14 by a pair of end plugs 16 formed from the same material as the cladding tube 14 and hermetically secured to the cladding tube 14 by a pair of circumferential welds 18 disposed at the ends of the cladding tube 14.

The end plugs 16 are formed to have the same peripheral configuration as the cladding tube 14 including relatively narrow projections 20 therein which fit within the cladding tube 14. A small clearance (not shown) is provided between the projections 20 and the fuel pellets 12 to permit relative differential expansion without subjecting the components of the fuel element to excessive thermal stress.

In accordance with the invention it is necessary to prevent the short circuiting of the current flow path of the thermoelectric portion of the fuel element 10 by the cladding tube 14. This may be achieved by forming the cladding tube 14 and end plugs 16 from an electrical insulating material, such as zirconium oxide. In the event, however, the cladding tube 14 is formed from a metal, as aforedescribed, the cladding tube 14 and the end plugs 16 are enshrouded within a tube 22 formed from insulating material, for example, from aluminum oxide or beryllium oxide.

The thermoelectric portion of the assembly 10 includes a number of tandemly arranged, annular thermoelectric members or wafers 24 and 26. The wafers 24 are formed from thermoelectrically positive material and the wafers 26 are formed from thermoelectrically negative material. The thermoelectrically positive wafers 24 may be formed by one of any number of suitable thermoelectric materials such as lead telluride, germanium telluride or bismuth germanium telluride. Similarly, the theremoelectrically negative material 26 may be formed from the same compositions as the p-type material 24 with the exception that the n-type material includes suitable doping compositions, in a known manner. In forming the assembly 10, the p and n-type wafers 24 and 26 are positioned to receive the insulating tube 22 in the central opening thereof and are tandemly mounted on the tube 22 in an alternating manner, so that a p-type wafer 24 is disposed axially adjacent to n-type wafer 26 and vice versa. Each of the thermoelectric wafers 24 and 26 is axially spaced from adjacent wafer by washer-shaped inserts of insulating material 28 and 30 with the inserts being formed from a material such as mica, aluminum oxide or other suitable compositions.

The thermoelectric wafers 24 and 26 are each provided with electrical contacting means disposed adjacent the inner and outer peripheries thereof. In this example, the contacting means comprises inner and outer circumferential jackets 32 and 34, respectively which are axially co-extensive with the associated wafers 24 and 26 and which are bonded thereto to provide good electrical contact in a manner to be described.

Each of the insulating discs 28 is sized to overlie the outer bridging members 34 and the insulating discs 30 are sized to overlie the inner bridging washers 32. It will be appreciated that the inner contacting member 32 is joined to form hot junctions for adjacent thermoelectric pellets 24 and 26 while the outer contacting rings 34 are joined to form the cold junctions. In furtherance of this purpose, the adjacent lateral edges of each of these pairs of rings are provided with annular grooves 36 and 38, respectively. Each adjacent pair of grooves 36 and 38 are thus arranged to receive an O-ring 40 or 42 of suitable diameter. Desirably, the O-rings 40 and 42 may be dipped into a brazing material, of known composition and the entire unit is heated after assembly to ensure electrical contact. In furtherance of this purpose, the grooves 36 and 38 are sized slightly smaller than the corresponding cross-sectional configurations of the O-rings 40 and 42 respectively. In certain applications the aforementioned brazing material can be omitted and electrical contact maintained by applying a compressive force to the thermoelectric pellets to maintain a forced fit.

The outer rings 40 receive therein the insulating discs 30 while the inner rings 42 are received within the central opening of the insulating discs 28. In this manner series electrical contact is made alternately between adjacent p and n-type thermoelectric washers 24 and 26 to provide a sinusoidal current flow path through the device. To bring the electrical path to the extremities of the element 10, a pair of annular end rings 44 are positioned at the extremities of the tandemly arranged thermoelectric pellets 24 and 26 with the annular end rings 44 being formed from a suitable metallic material and being electrically connected to the adjacent washer 24 by electrically conducting O-rings 40′ respectively. If desired, the outer circumferential surface of the assembly 10 may be clad by a tubular cladding member 46, formed from insulating material such as aluminum oxide or beryllium oxide.

One method for applying the contacting rings 32 and 24 to the associated thermoelectric washers 24 and 26 comprises the co-extrusion of an annular billet of thermoelectric material and a pair of elongated contacting rings 32 and 34. The billet and the cylinders are each drawn through a suitable die to form an annular extrusion. The co-extrusion of the materials comprising the contacting rings 32 and 34 and the thermoelectric material 44 or 26 sandwiched therebetween provide the bond which insures electrical contact between these components. The extruded arrangement is then cut transversely into relatively short segments. Each of the segments then form an assembly consisting of the outer and inner contacting means 32 and 34 and the thermoelectric washer 24 or 26 bonded therebetween. Inasmuch as the inner contacting rings 32 form the hot junction of the thermoelectric assembly 10, the contacting members 32 desirably are formed from a suitable electrically conductive high temperature material such as iron, stainless steel or niobium. On the other hand, the outer contacting members 34, which form the cool junction for the thermoelectric arrangement 10 may be formed from a lower melting point material, such as copper or aluminum.

The assembly 10 is desirably inserted into a nuclear reactor to cause fissioning of the fuel pellets 12, thereby causing the heating of the cladding tubes 14 and 22 as well as the heating of the hot junctions 32. The assembly 10, when inserted into a reactor, is exposed to a reactor coolant flowing past the outer clad 46 with the coolant being at a lower temperature than the temperature within the fuel pellets 12. As a result the contacting members 34 form the cool junction for the thermoelectric assembly 10 and electrical power is generated between the end pieces 44 by each of the thermoelectric stages therebetween.

An arrangement for providing a series electrical flow path through each of the thermoelectric stages without necessitating the bonding of contacting members across adjacent thermoelectric results from the aforedescribed construction. It is to be appreciated that many modifications may be made in the illustrative embodiment of the invention described in detail herein. Accordingly, it is specifically intended that the above description be interpreted as illustrative of this invention rather than as limitive thereof.

We claim as our invention:

1. In an energy converter comprising a theremoelectric series and means for supplying heat to the hot junctions of said series and for removing heat from said cold junctions thereof, the combination comprising, a number of thermoelectric components, each of said components including an annular thermoelectric member, an inner contacting ring bonded to the inner surface of each of said members, an outer contacting ring bonded to the outer surface of each of said members, and means for making electric contact between adjacent pairs of said inner rings and of said outer rings respectively, said last-mentioned means including the rings of each of said pairs having grooves on their confronting lateral surfaces and a conductive O-ring having substantially the same diameter as that of said grooves to establish electric contact between the rings of each of said pairs but to space said rings and their associated thermoelectric members for purposes of electrically insulating said members.

2. In an energy converter comprising a thermoelectric series and means for supplying heat to the hot junctions of said series and for removing heat from the cold junctions thereof, the combination comprising, a number of thermoelectric components, each of said components including an annular thermoelectric member, an inner contacting ring bonded to and axially co-extensive with the inner surface of each of said members, an outer contacting ring bonded to and axially co-extensive with the outer surface of each of said members, and means for making electric contact between adjacent pairs of said inner rings and of said outer rings respectively, said last-mentioned means including the rings of each of said pairs having grooves on their confronting lateral surfaces and a conductive O-ring having substantially the same diameter as that of said grooves positionable partially in an associated pair of said grooves to establish electric contact between the rings of each of said pairs but to space said rings and their associated thermoelectric members for purposes of electrically insulating said members.

References Cited by the Applicant

UNITED STATES PATENTS

| | | |
|---|---|---|
| 2,811,568 | 10/57 | Lloyd. |
| 3,117,913 | 1/64 | Shoupp. |

WINSTON A. DOUGLAS, *Primary Examiner*.